US012601057B2

(12) United States Patent
Bi et al.

(10) Patent No.: US 12,601,057 B2
(45) Date of Patent: Apr. 14, 2026

(54) SOAKING AND ESC CLAMPING SEQUENCE FOR HIGH BOW SUBSTRATES

(71) Applicant: LAM RESEARCH CORPORATION, Fremont, CA (US)

(72) Inventors: Feng Bi, Lake Oswego, OR (US); Kapu Sirish Reddy, Portland, OR (US); Niraj Rana, West Linn, OR (US); Ateeq Junaid Suria, Portland, OR (US); Toshisato Ono, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 26 days.

(21) Appl. No.: 18/714,638

(22) PCT Filed: Dec. 5, 2022

(86) PCT No.: PCT/US2022/051823
§ 371 (c)(1),
(2) Date: May 30, 2024

(87) PCT Pub. No.: WO2023/107376
PCT Pub. Date: Jun. 15, 2023

(65) Prior Publication Data
US 2025/0027198 A1      Jan. 23, 2025

Related U.S. Application Data

(60) Provisional application No. 63/288,547, filed on Dec. 11, 2021.

(51) Int. Cl.
*C23C 16/02* (2006.01)
*C23C 16/455* (2006.01)
*C23C 16/458* (2006.01)

(52) U.S. Cl.
CPC .... *C23C 16/45557* (2013.01); *C23C 16/0209* (2013.01); *C23C 16/4583* (2013.01)

(58) Field of Classification Search
CPC ..................... C23C 16/0209; C23C 16/45557
See application file for complete search history.

(56) References Cited

U.S. PATENT DOCUMENTS 4,724,222 A * 2/1988 Feldman ............. H01L 21/6838
269/21
2006/0172553 A1 8/2006 Choi et al.
(Continued)

FOREIGN PATENT DOCUMENTS

EP 1298720 A1 4/2003
JP 2020065018 A 4/2020
WO WO-2019050696 A1 * 3/2019 ....... H01L 21/68757

OTHER PUBLICATIONS

International Search Report and Written Opinion of the ISA issued in PCT/US2022/051823, mailed Apr. 27, 2023; ISA/ KR.

*Primary Examiner* — Cachet I Proctor

(57) ABSTRACT

A method for processing a substrate comprises a) delivering a substrate to a pedestal of an electrostatic chuck (ESC) of a processing chamber; b) increasing a pressure in the processing chamber to a first predetermined pressure in a first predetermined pressure range; c) soaking the substrate at the first predetermined pressure for a first predetermined period without clamping the substrate; d) after the first predetermined period, ramping a clamping voltage supplied to the ESC to a first clamping voltage during a second predetermined period; e) after the second predetermined period, increasing the pressure in the processing chamber to a predetermined process pressure greater than the first predetermined pressure; and f) performing a treatment on the substrate at the predetermined process pressure.

22 Claims, 9 Drawing Sheets

(56)  References Cited

U.S. PATENT DOCUMENTS

| 2008/0180873 A1* | 7/2008 | Boyd ................. H01L 21/6833 |
| | | 361/234 |
| 2016/0079057 A1* | 3/2016 | Varadarajan ...... C23C 16/45597 |
| | | 438/785 |
| 2017/0162417 A1* | 6/2017 | Ye .................... H01J 37/32091 |

* cited by examiner

Change in Bow with Temperature

Shape of Wafer with Temperature

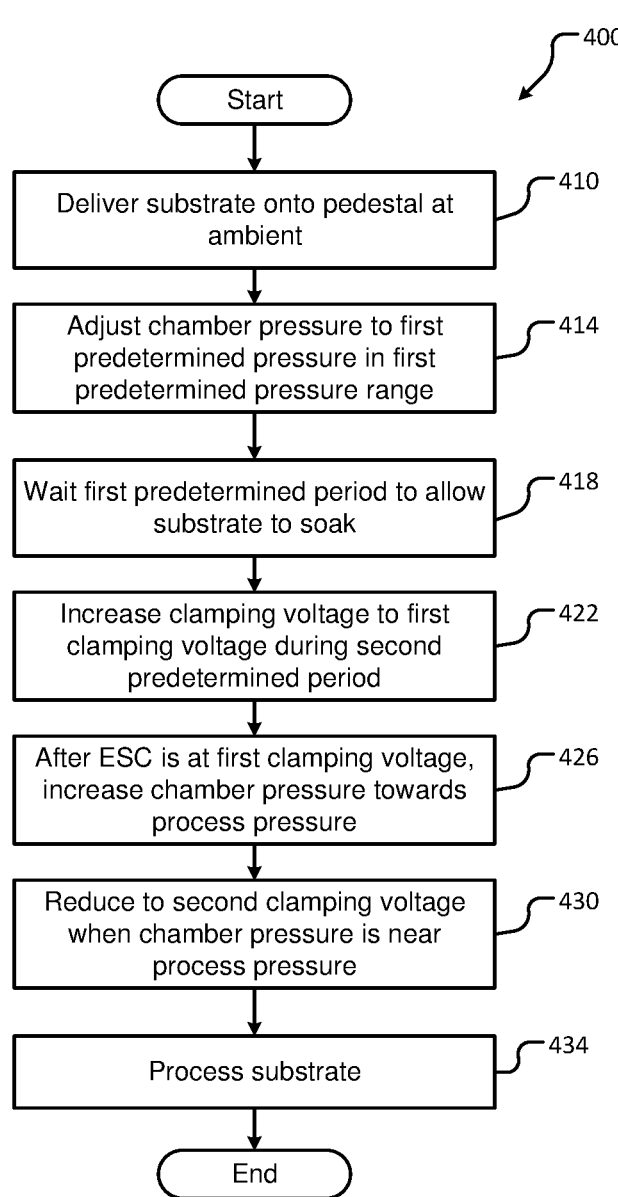

Start

Deliver substrate onto pedestal at ambient ⟋410

Adjust chamber pressure to first predetermined pressure in first predetermined pressure range ⟋414

Wait first predetermined period to allow substrate to soak ⟋418

Increase clamping voltage to first clamping voltage during second predetermined period ⟋422

After ESC is at first clamping voltage, increase chamber pressure towards process pressure ⟋426

Reduce to second clamping voltage when chamber pressure is near process pressure ⟋430

Process substrate ⟋434

End

FIG. 4

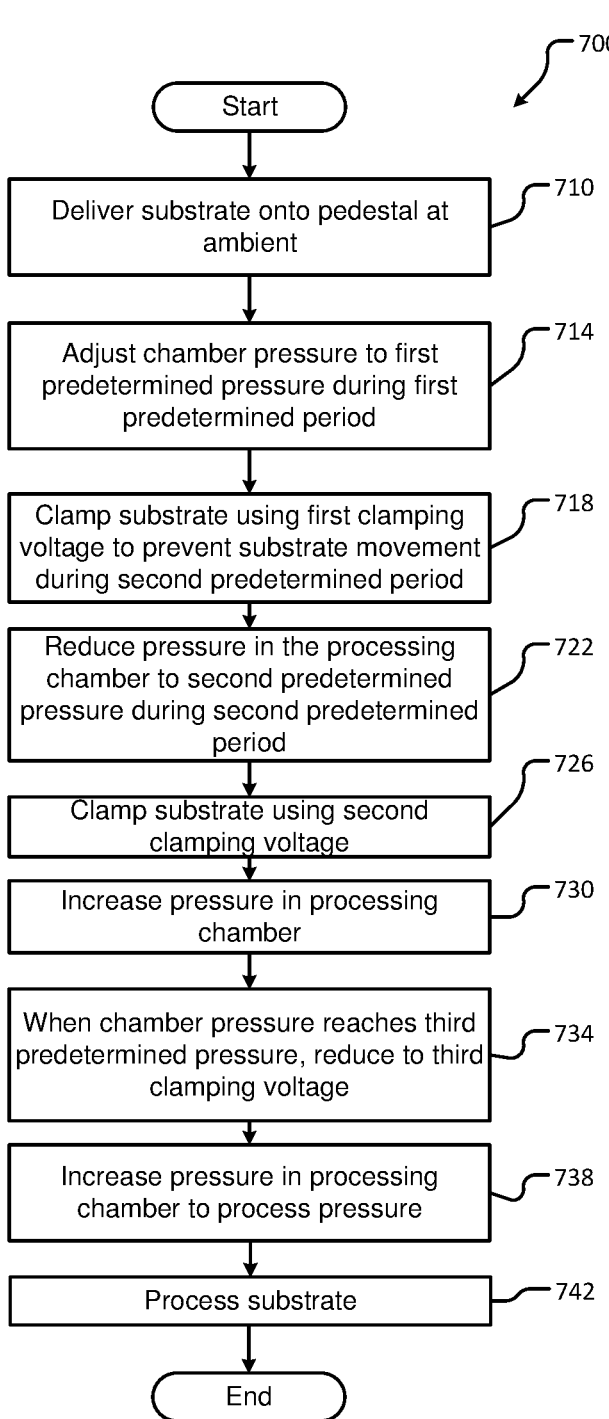

700

Start

Deliver substrate onto pedestal at ambient — 710

Adjust chamber pressure to first predetermined pressure during first predetermined period — 714

Clamp substrate using first clamping voltage to prevent substrate movement during second predetermined period — 718

Reduce pressure in the processing chamber to second predetermined pressure during second predetermined period — 722

Clamp substrate using second clamping voltage — 726

Increase pressure in processing chamber — 730

When chamber pressure reaches third predetermined pressure, reduce to third clamping voltage — 734

Increase pressure in processing chamber to process pressure — 738

Process substrate — 742

End

SOAKING AND ESC CLAMPING SEQUENCE FOR HIGH BOW SUBSTRATES

CROSS-REFERENCE TO RELATED APPLICATIONS

This application is a U.S. National Phase Application under 35 U.S.C. 371 of International Application No. PCT/US2022/051823, filed on Dec. 5, 2022, which claims the benefit of U.S. Provisional Application No. 63/288,547, filed on Dec. 11, 2021. The entire disclosures of the above applications are incorporated herein by reference.

FIELD

The present disclosure relates to substrate processing systems and more particularly to a soak sequence and electrostatic chuck clamp method for deposition processes.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to perform treatments on substrates such as semiconductor wafers. Examples of the treatments include deposition, etching, cleaning and/or other treatments. During processing, the substrate is subjected to multiple deposition, etching, cleaning and/or other treatments in one or more processing chambers. The substrate is typically processed in one processing chamber and then moved to one or more additional processing chambers for subsequent treatment steps.

A substrate is typically delivered onto a pedestal of an electrostatic chuck (ESC) in one of the processing chambers. There may be a temperature differential between the substrate and the pedestal. Prior to processing the substrate, the substrate is heat soaked and clamped. Preferably these steps are done quickly to increase throughput. If the substrate is heated by the ESC too quickly, the substrate can be damaged. Uniform heating of the substrate is related to the temperature differential between the substrate and the pedestal, pressure in the processing chamber, bowing of the substrate, thermal conductivity of gas(es) in the processing chamber, the degree of clamping of the substrate and/or other factors.

Ideally the substrate is clamped in a planar position and has uniform temperature from the center to the edge prior to initiating the treatment. However, the substrate may be bowed (curvature from center to edge) when delivered and/or bowing of the substrate may occur during heating of the substrate. Bowing makes the substrate difficult to clamp in a planar position and/or may contribute to temperature non-uniformity (NU) from center to edge. If the substrate remains bowed after clamping, a gap may exist between edges of the substrate and the pedestal of the ESC during processing. If the substrate is bowed after clamping, arcing may occur between the substrate and minimum contact areas (MCAs) of the pedestal, which damages the pedestal and increases manufacturing cost and down time. If the substrate has temperature NU from center to edge during processing, defects are more likely to occur.

During processing, a gas delivery system supplies a process gas mixture to the processing chamber. Plasma may be used to promote chemical reactions. After the treatment, the substrate is de-clamped and the substrate is removed from the processing chamber.

SUMMARY

A method for processing a substrate comprises a) delivering a substrate to a pedestal of an electrostatic chuck (ESC) of a processing chamber; b) increasing a pressure in the processing chamber to a first predetermined pressure in a first predetermined pressure range; c) soaking the substrate at the first predetermined pressure for a first predetermined period without clamping the substrate; d) after the first predetermined period, increasing a clamping voltage supplied to the ESC to a first clamping voltage during a second predetermined period; e) after the second predetermined period, increasing the pressure in the processing chamber to a predetermined process pressure greater than the first predetermined pressure; and f) performing a treatment on the substrate at the predetermined process pressure.

In other features, after e) and before f), the method includes reducing the clamping voltage to a second clamping voltage less than the first clamping voltage when the pressure is greater than a second predetermined pressure that is greater than the first predetermined pressure and less than the predetermined process pressure.

In other features, during the second predetermined period, the pressure is maintained at the first predetermined pressure. The substrate comprises a bowed substrate with bowing greater than 200 um at ambient temperature without clamping.

A method for soaking and clamping a substrate comprises a) delivering a substrate to a pedestal of an electrostatic chuck (ESC) of a processing chamber; b) increasing a pressure in the processing chamber to a first predetermined pressure in a first predetermined pressure range during a first predetermined period, wherein the first predetermined pressure is greater than a predetermined process pressure; c) clamping the substrate using a first clamping voltage for a second predetermined period; d) decreasing pressure in the processing chamber to a second predetermined pressure in a second predetermined pressure range during the second predetermined period; e) increasing the first clamping voltage to second clamping voltage during a third predetermined period and increasing the pressure in the processing chamber; and f) performing a treatment on the substrate at the predetermined process pressure.

In other features, after e) and before f), the method includes reducing the second clamping voltage to a third clamping voltage that is less than the second clamping voltage when the pressure is greater than a second predetermined pressure, wherein the second predetermined pressure is greater than the first predetermined pressure and less than the predetermined process pressure. The substrate comprises a bowed substrate with bowing greater than 200 um at ambient temperature without clamping.

A method for soaking and clamping a substrate comprises a) delivering a substrate to a pedestal of an electrostatic chuck (ESC) of a processing chamber; b) increasing a pressure in the processing chamber to a first predetermined pressure in a first predetermined pressure range during a first predetermined period; c) after the first predetermined period, clamping the substrate at a first clamping voltage for a second predetermined period; d) after the second predetermined period, de-clamping the substrate during a third predetermined period; e) after the third predetermined period, clamping the substrate at a second clamping voltage for a fourth predetermined period; f) after the fourth predetermined period, increasing the pressure in the processing chamber to a predetermined process pressure; and g) processing the substrate at the predetermined process pressure.

In other features, after e) and before f), the method includes reducing the second clamping voltage to a third clamping voltage that is less than the second clamping voltage when the pressure is greater than a second predetermined pressure, wherein the second predetermined pressure is greater than the first predetermined pressure and less than the predetermined process pressure.

In other features, the pressure during the second predetermined period is the first predetermined pressure. The pressure during the third predetermined period is the first predetermined pressure. The first predetermined pressure is less than an arcing pressure.

A substrate processing system for processing a substrate comprises a processing chamber comprising an electrostatic chuck with electrodes. A gas delivery system is configured to deliver a gas mixture to the processing chamber. A voltage source is configured to supply a clamping voltage to the electrodes. A controller is configured to cause the gas delivery system and the voltage source to a) increase a pressure in the processing chamber in one or more steps to a first predetermined pressure in a first predetermined pressure range; b) soak the substrate at the first predetermined pressure for a first predetermined period without clamping the substrate; c) after the first predetermined period, increase a clamping voltage supplied to the electrostatic chuck to a first clamping voltage during a second predetermined period; d) after the second predetermined period, increase the pressure in the processing chamber to a predetermined process pressure greater than the first predetermined pressure; and e) perform a treatment on the substrate at the predetermined process pressure.

In other features, after e) and before f), the controller is further configured to reduce the clamping voltage to a second clamping voltage less than the first clamping voltage when the pressure is greater than a second predetermined pressure that is greater than the first predetermined pressure and less than the predetermined process pressure. During the second predetermined period, the pressure is maintained at the first predetermined pressure. The substrate comprises a bowed substrate with bowing greater than 200 um at ambient temperature without clamping.

A substrate processing system for processing a substrate comprises a processing chamber including an electrostatic chuck with electrodes. A gas delivery system is configured to deliver a gas mixture to the processing chamber. A voltage source is configured to supply a clamping voltage to the electrodes. A controller is configured to cause the gas delivery system and the voltage source to a) increase a pressure in the processing chamber in one or more steps to a first predetermined pressure in a first predetermined pressure range during a first predetermined period, wherein the first predetermined pressure is greater than a predetermined process pressure; b) clamp the substrate using a first clamping voltage for a second predetermined period; c) decrease pressure in the processing chamber to a second predetermined pressure in a second predetermined pressure range during the second predetermined period; d) increase the first clamping voltage to second clamping voltage during a third predetermined period and increasing the pressure in the processing chamber; and e) perform a treatment on the substrate at the predetermined process pressure.

In other features, after e) and before f), the controller is further configured to reduce the second clamping voltage to a third clamping voltage that is less than the second clamping voltage when the pressure is greater than a second predetermined pressure, wherein the second predetermined pressure is greater than the first predetermined pressure and less than the predetermined process pressure. The substrate comprises a bowed substrate with bowing greater than 200 um ambient temperature without clamping.

A substrate processing system for processing a substrate comprises a processing chamber including an electrostatic chuck with electrodes. A gas delivery system is configured to deliver a gas mixture to the processing chamber. A voltage source is configured to supply a clamping voltage to the electrodes. A controller is configured to cause the gas delivery system and the voltage source to a) increase a pressure in the processing chamber in one or more steps to a first predetermined pressure in a first predetermined pressure range during a first predetermined period; b) after the first predetermined period, clamp the substrate at a first clamping voltage for a second predetermined period; c) after the second predetermined period, de-clamp the substrate during a third predetermined period; d) after the third predetermined period, clamp the substrate at a second clamping voltage for a fourth predetermined period; e) after the fourth predetermined period, increase the pressure in the processing chamber to a predetermined process pressure; and f) process the substrate at the predetermined process pressure.

In other features, after e) and before f), the controller is further configured to reduce the clamping voltage to a second clamping voltage less than the first clamping voltage when the pressure is greater than a second predetermined pressure that is greater than the first predetermined pressure and less than the predetermined process pressure. During the second predetermined period, the controller is configured to maintain the pressure at the first predetermined pressure. The substrate comprises a bowed substrate with bowing greater than 200 um at ambient temperature without clamping.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 is a flowchart of an example of a method for soaking and clamping a substrate according to the present disclosure;

FIG. 7 is a flowchart of an example of another method for soaking and clamping a substrate according to the present disclosure;

In the drawings, reference numbers may be reused to identify similar and/or identical elements.

DETAILED DESCRIPTION

Figure 1:
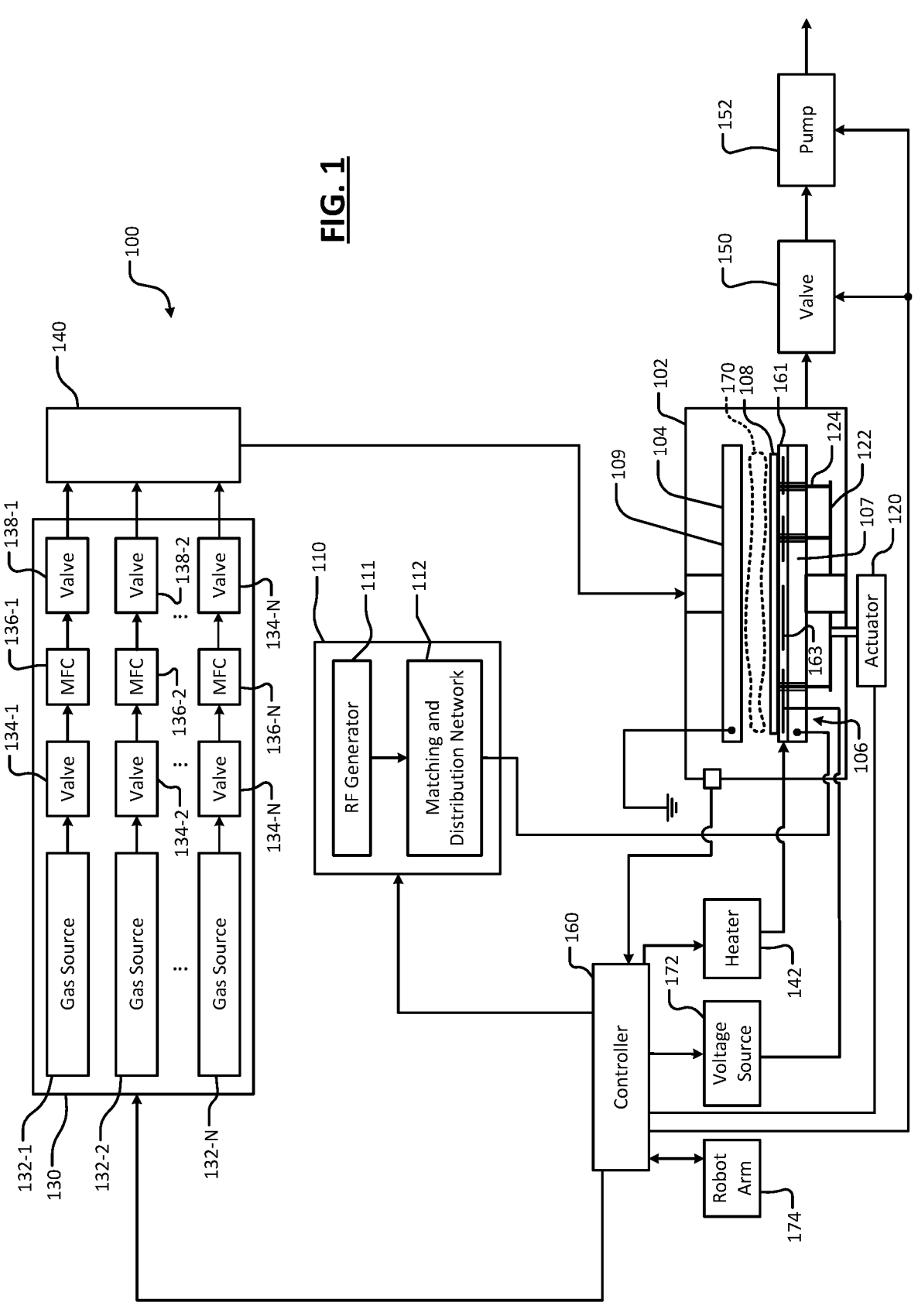
FIG. 1 is a functional block diagram of an example of a substrate processing chamber according to the present disclosure.

High tensile, bowed substrates experience significant thermal deformation in high temperature processes during 3D-NAND fabrication. As used herein, high tensile, bowed substrates have bowing greater than 200 micrometers (um) at an edge at ambient or room temperature. The thermal deformation is very challenging when clamping the substrate. During a soak and clamp sequence, the high tensile, bowed substrate is delivered onto a pedestal of an electrostatic chuck (ESC).

Generally, the processes are optimized to have a shortest cycle time. Increased heating generally occurs at higher pressure. Therefore, the pressure is increased to a first predetermined pressure just below an arcing pressure, which corresponds to a pressure where arcing can occur if clamping is performed at full clamping voltage. In some processes, the arcing pressure is around 4-5 Torr. When the pressure reaches a first predetermined pressure, the substrate is soaked for a period to decrease temperature NU and then the substrate is fully clamped. For example, the first predetermined pressure is near the arcing pressure if clamping was performed (e.g. greater than 75% of the arcing pressure). At this point, the substrate tends to have a hot center and a cooler edge and thus has poor temperature non-uniformity (NU).

After clamping the substrate, chamber pressure is increased to a predetermined process pressure (higher than the first predetermined pressure) (or process pressure) and the substrate is processed. In some examples, the predetermined process pressure is greater than around twice the arcing pressure (+/-10%), although other pressures can be used.

The soak and clamp sequence described above has marginal clamping capability for high tensile, bowed substrates. The edge of the substrate may not be fully clamped onto the pedestal surface prior to increasing the clamping voltage and pressure. For example, an edge of the substrate may be displaced by a gap of 0.1 to 4 mm. As a result of the gap, there is a substantial risk of arcing during the process. The arcing induces local DC discharge that degrades a minimum contact area (MCA) surface of a pedestal of the ESC, which reduces pedestal lifetime and increases cost. Furthermore, a backside surface of the substrate may be scratched during the process.

The present disclosure relates to systems and methods for performing a soak and clamping sequence for a substrate using an electrostatic chuck (ESC). The systems and methods described further below address clamping issues for substrates such as high tensile, bowed substrates that are difficult to handle using prior soak and clamping techniques. These systems and methods show improved clamping and de-clamping performance as compared with prior approaches, reduced damage to a minimum contact area (MCA) surfaces of a pedestal of the ESC and reduced scratching of the backside surface of the substrate.

In a first method, the substrate (such as a high tensile, bowed substrate) is clamped at lower pressure during substrate heating while substrate deformation is still small. Normally, clamping is performed at a higher pressure that is close to the arcing pressure to minimize the heating time and processing time. This approach, however, leads to additional substrate bowing and problems when clamping.

After the substrate is delivered to the pedestal, the substrate is soaked at a first predetermined pressure for a first predetermined period while the substrate has small deformation at lower temperature. In some examples, the first predetermined pressure is greater than 20% and less than 50% of the arcing pressure. After the first predetermined period, the ESC clamps the substrate. After clamping the substrate, the pressure in the processing chamber is increased to a second predetermined pressure for a second predetermined period. During the second predetermined period, the substrate reaches thermal steady state with the ESC. After the second predetermined period, the pressure in the processing chamber is adjusted to the process pressure and the process is initiated. In some examples the process pressure is 9 to 12 Torr, although other pressures can be used.

In another approach, the substrate is delivered onto the pedestal of the ESC. The pressure in the processing chamber is adjusted to a first predetermined pressure in a predetermined pressure range at or above the process pressure and the substrate is allowed to soak in an inert gas environment. Gas thermal conductivity is proportional to gas pressure. At higher pressure, the heat transfer is more efficient. When the substrate reaches thermal steady state (e.g. close to a desired substrate temperature), pressure in the processing chamber is reduced to a second predetermined pressure in a second predetermined pressure range (in some examples, below the arcing pressure) and the ESC clamps the substrate at a first predetermined clamping voltage. After the substrate is chucked, the pressure in the processing chamber is increased to the process pressure and the clamping voltage is reduced to a second predetermined clamping voltage that is less the first predetermined clamping voltage.

In another approach, the substrate is delivered to the pedestal, pressure in the processing chamber is set to a predetermined pressure range (less than the process pressure and the arcing pressure) and the ESC clamps the substrate to uniformly soak the substrate for a first predetermined period. This helps the substrate to reach thermal steady state quickly with small temperature non-uniformity from a center of the substrate to an edge of the substrate. Then, the ESC clamping force is removed for a second predetermined period to allow the substrate to relax. This step removes lateral strain due to thermal expansion. After the second predetermined period, the ESC clamps the substrate with less vertical strain. Then, the pressure in the processing chamber is set to process pressure and the process is initiated.

Referring now to FIG. 1, an example of a substrate processing system 100 for performing a substrate treatment is shown. In the example described below, the substrate processing system may perform plasma-enhanced chemical vapor deposition (PECVD). However, other types of substrate treatments both with and without plasma may be performed.

The substrate processing system 100 includes a processing chamber 102 that encloses other components of the substrate processing system 100 and contains the RF plasma (if used). The substrate processing system 100 includes an upper electrode 104 and an electrostatic chuck (ESC) 106. In some examples, the ESC 106 includes a ceramic top layer 161 bonded to a baseplate 107 acting as a lower electrode. During operation, a substrate 108 is arranged on the ESC 106 between the upper electrode 104 and the lower electrode. The ESC 106 includes electrodes 163 that electrostatically attract the substrate during deposition. The electrodes 163 can be monopolar electrodes or bipolar electrodes.

For example, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

An RF generating system 110 generates and outputs RF power to one of the upper electrode 104 and the lower electrode. The other one of the upper electrode 104 and the lower electrode may be DC grounded, AC grounded or floating. For example, the RF generating system 110 may include an RF generator 111 that generates the RF power that is fed by a matching and distribution network 112 to the lower electrode and the upper electrode 104 is grounded (or vice versa). An actuator 120 and a lift pin assembly 122 including P lift pins (where P is an integer greater than 2) are used during loading and unloading of the substrate from the chamber.

A gas delivery system 130 includes one or more gas sources 132-1, 132-2, . . . , and 132-N (collectively gas sources 132), where N is an integer greater than zero. The gas sources 132 supply one or more process gases such as deposition precursors, purge gas, etch gas, etc. In some examples, vaporized precursors may also be used (not shown). The gas sources 132 are connected by valves 134-1, 134-2, . . . , and 134-N (collectively valves 134), mass flow controllers 136-1, 136-2, . . . , and 136-N (collectively mass flow controllers 136), and valves 138-1, 138-2, . . . , and 138-N (collectively valves 138) to a manifold 140. An output of the manifold 140 is fed by the gas delivery system 130 to the processing chamber 102. For example, the output of the manifold 140 is fed to the showerhead 109.

A heater 142 may be connected to a resistive heater arranged in the ESC 106. The heater 142 may be used to control a temperature of the ESC 106 and the substrate 108. In addition, the ESC 106 may include internal channels (not shown) to flow a fluid from a fluid source (not shown) to provide further control of the pedestal and substrate temperatures. A valve 150 and pump 152 may be used to evacuate reactants from the processing chamber 102 and/or to control pressure in the processing chamber. A controller 160 may be used to control the various components of the substrate processing system 100 described herein.

As will be described further below, the controller 160 causes a robot arm 174 to load the substrate 108 onto the ESC 106. The controller 160 also causes a voltage source 172 to selectively apply one or more voltage signals to the electrodes 163 (either monopolar or bipolar). The controller 160 communicates with the gas delivery system 130 to control supply of process, purge and/or inert gases. The controller communicates with the valve 150 and pump 152 to control pressure within the processing chamber and/or evacuation of reactants.

Figure 2:
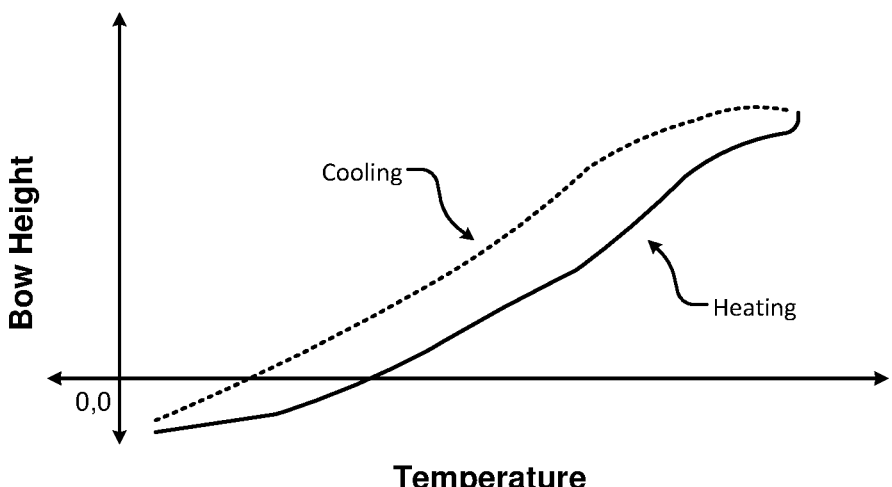
FIG. 2 is a graph illustrating bow height as a function of temperature during heating and cooling.
Figure 3:
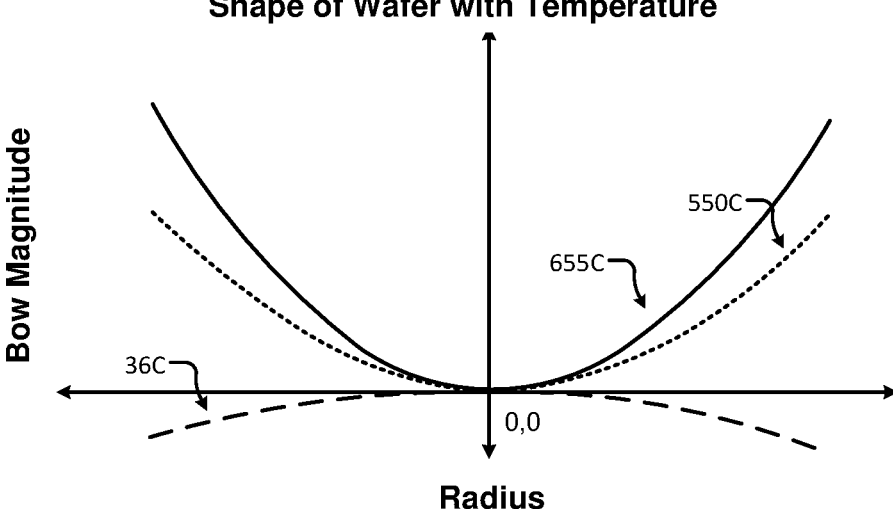
FIG. 3 is a graph illustrating bow magnitude as a function of radius at different substrate temperatures.

Referring now to FIGS. 2 and 3, bowing of the substrate during heating and cooling is affected in part by substrate temperature and/or chamber pressure. In FIG. 2, bow height is shown as a function of temperature during heating and cooling. In FIG. 3, bow magnitude is shown as a function of a radius of the substrate at different substrate temperatures.

Figure 5:
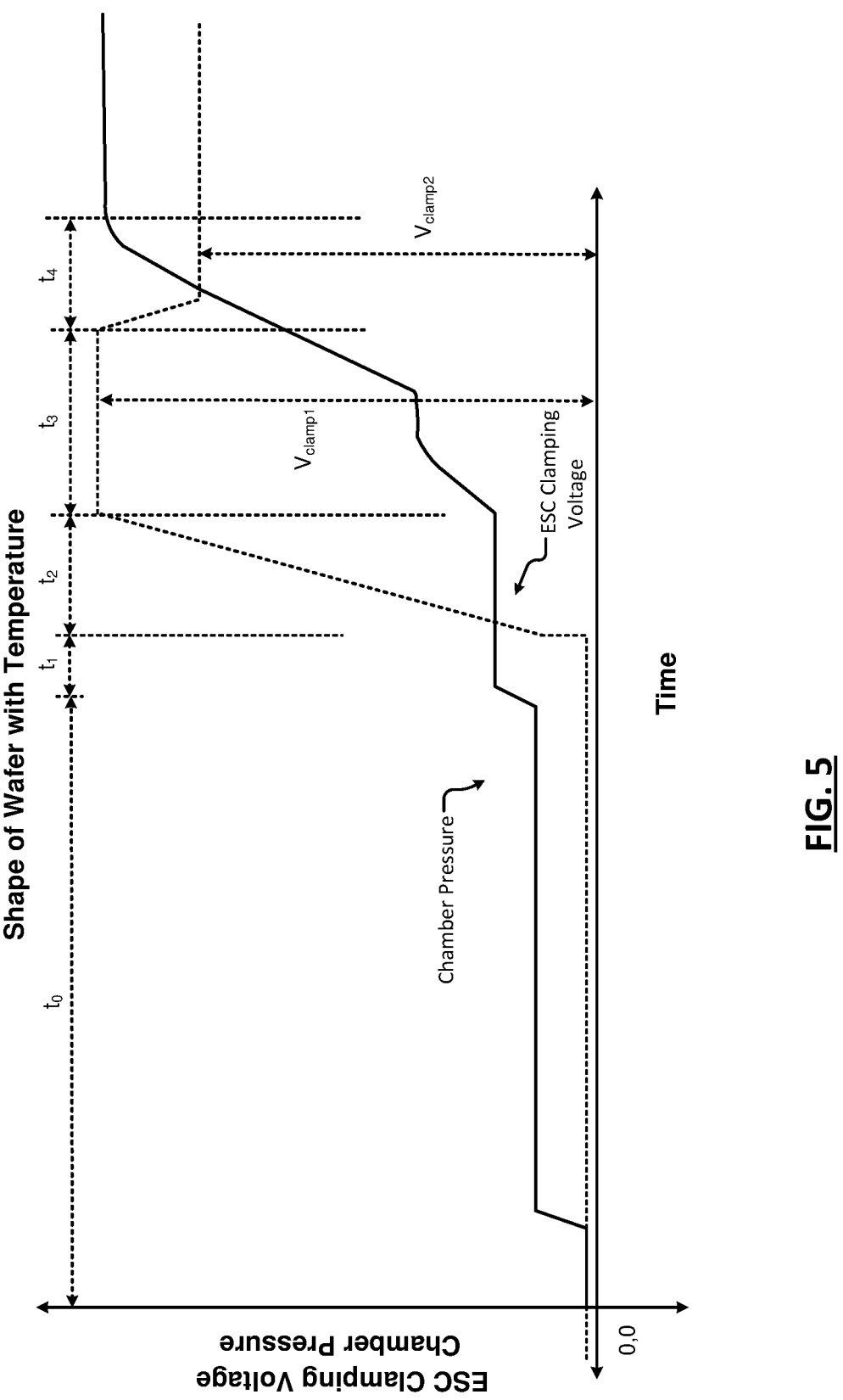
FIG. 5 is a graph illustrating an example of timing of changes in chamber pressure and clamping voltage according to the present disclosure.

Referring now to FIGS. 4 and 5, a method 400 for soaking and clamping a substrate is shown. After the substrate is delivered to the pedestal at 410, the chamber pressure is increased at 414 to a first predetermined pressure in a first predetermined pressure range. In some examples, the first predetermined pressure range is from 1-3 Torr, although other pressures can be used. The substrate is soaked at the first predetermined pressure for a first predetermined period t1 at 418. At this point, the substrate is at a relatively low temperature and pressure and the substrate has relatively small deformation or bowing.

After the first predetermined period t1, the ESC clamping voltage is increased or ramped to clamp the substrate with increasing force. In some examples, the ESC clamping voltage is ramped to a first clamping voltage during a second predetermined period t2 at 422.

When the ESC reaches the first clamping voltage, the chamber pressure is increased or ramped towards the predetermined process pressure at 426 during a third predetermined period t3. In some examples, the pressure is increased to increase the substrate temperature.

When the pressure in the processing chamber reaches a second predetermined pressure (less than the predetermined process pressure), the ESC clamping voltage is optionally reduced to a second clamping voltage less than the first clamping voltage at 430. In some examples, the second clamping voltage is about 65%-85% of the first clamping voltage.

The pressure continues to increase to the process pressure during a fourth predetermined period t4. During the periods t1 to t4, the substrate reaches thermal steady state with the pedestal. After the fourth predetermined period t4, the substrate is processed in the processing chamber at 434.

Figure 6A:
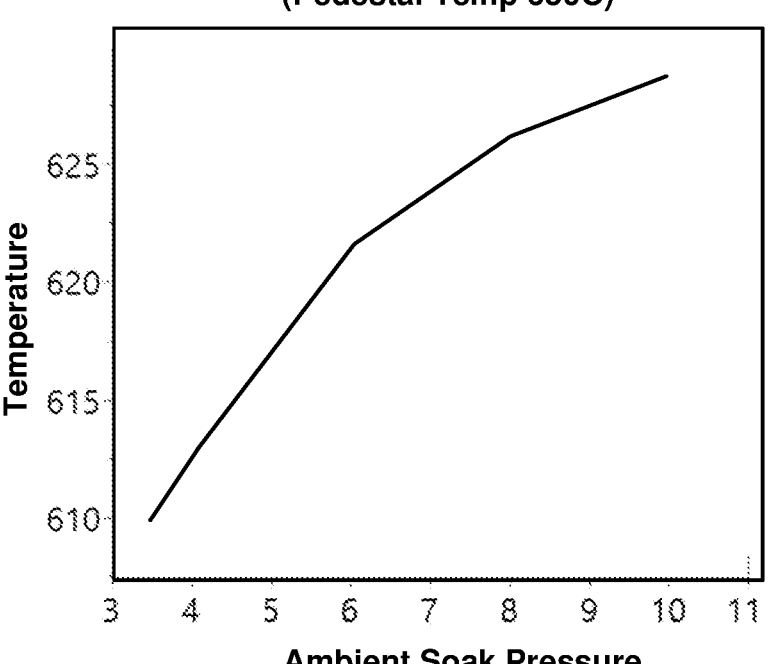
FIG. 6A is a graph illustrating temperature as a function of ambient soak pressure.
Figure 6B:
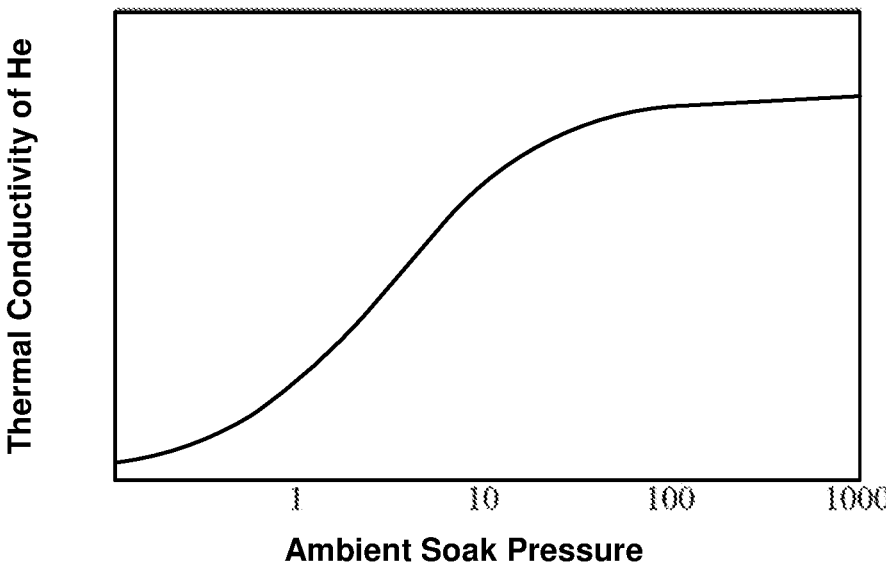
FIG. 6B is a graph illustrating thermal conductivity of helium as a function of ambient soak pressure.

Referring now to FIGS. 6A and 6B, increased pressure increases both thermal conductivity and the temperature of the substrate. In FIG. 6A, substrate temperature is shown as a function of ambient soak pressure for a pedestal at 650° C. In FIG. 6B, thermal conductivity of helium (He) is shown as a function of ambient soak pressure. As can be appreciated, gas at higher pressure has higher thermal conductivity. At higher soak pressure, the substrate reaches a stabilized temperature closer to a pedestal setpoint.

Figure 8:
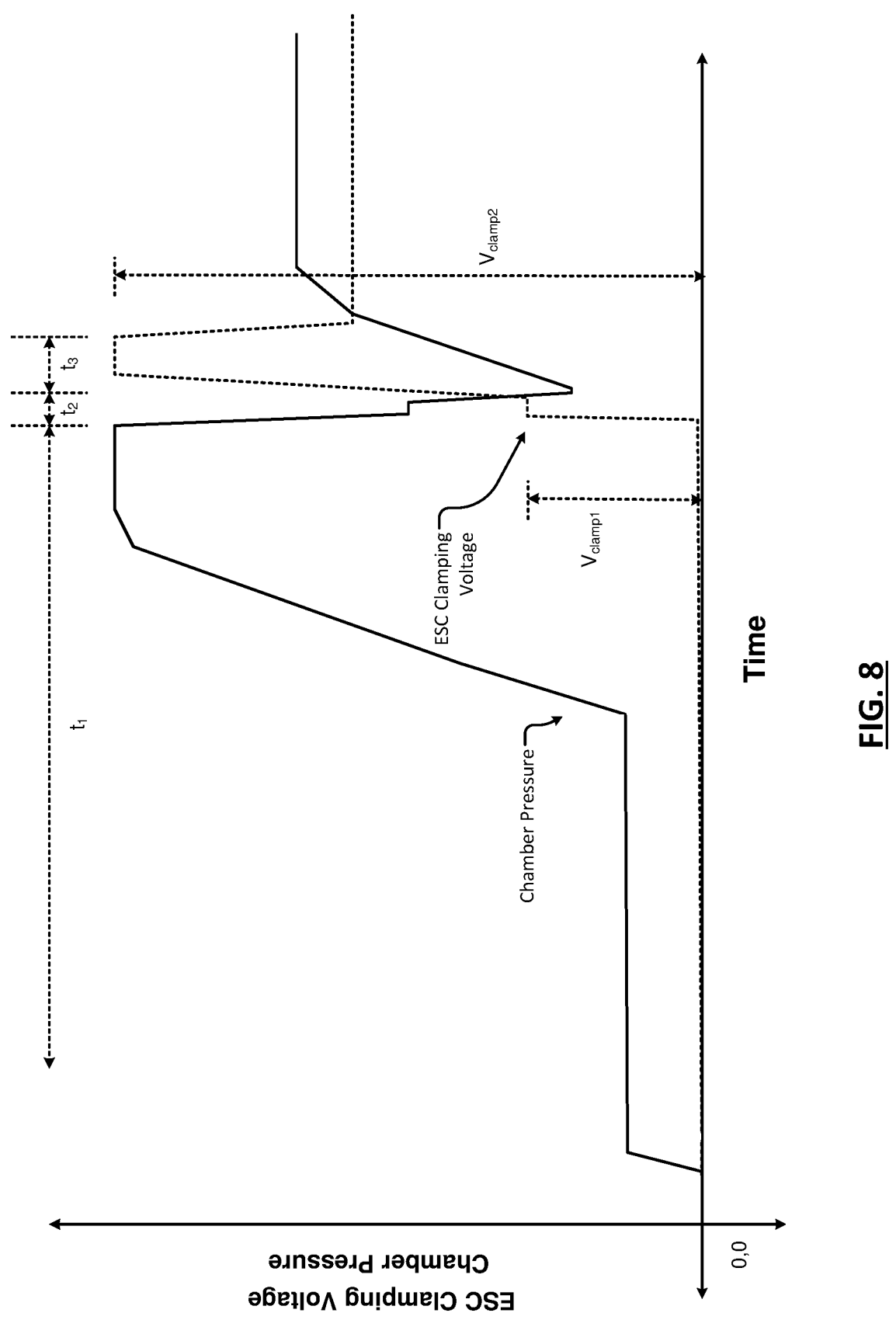
FIG. 8 is a graph illustrating an example of timing of changes in chamber pressure and clamping voltage according to the present disclosure.

Referring now to FIGS. 7 and 8, another method 700 for soaking and clamping a substrate is shown. The method 700 uses higher pressure during an initial soak period without clamping the substrate (to avoid arcing). After the soak at high pressure, the method reduces chamber pressure below an arcing pressure and lightly clamps the substrate. The method increases the clamping voltage to a high clamping voltage and increases pressure towards the process pressure. Before reaching the process pressure, the clamping voltage is reduced to a process clamping voltage.

More particularly, the substrate is delivered onto the pedestal of the ESC at 710 at ambient pressure (e.g. near vacuum). At 714, the chamber pressure is adjusted to a first predetermined pressure in a predetermined pressure range during a first predetermined period t1. In some examples, the first predetermined pressure is greater than the process pressure. The substrate is allowed to soak in an inert gas environment such as He during first predetermined period t1, although other gases can be used.

As can be seen in FIGS. 6A and 6B, gas thermal conductivity is proportional to gas pressure. At higher pressure, the heat transfer is more efficient. When the substrate is heated sufficiently (e.g. temperatures of the pedestal and substrate are sufficiently close), the substrate is lightly clamped and then pressure in the processing chamber is reduced below the arcing pressure to allow the substrate to be fully clamped with higher clamping voltage (and without arcing). At 718, the ESC clamps the substrate using a first clamping voltage for a second predetermined period t2. In some examples, the first clamping voltage is less than one half of a second or full clamping voltage and less than a third or process clamping voltage. In some examples, the first clamping voltage is in a range from 20 to 50% of the second clamping voltage and the third clamping voltage is in a range from 65 to 85% of the second clamping voltage, although other values can be used.

After lightly clamping at the first clamping voltage, pressure in the processing chamber is reduced at 722 to a second predetermined pressure in a second predetermined pressure range. In some examples, the second predetermined pressure range is less than arcing pressure, although other pressures can be used. In some examples, the second predetermined pressure is less than a pressure that would cause arcing when the second or full clamping voltage is used.

After reducing the chamber pressure to the second predetermined pressure at 722, the clamping voltage is increased to the second clamping voltage at 726 during a second predetermined period t3. At 730, the pressure is increased towards a process pressure (less than the first predetermined pressure). When the chamber pressure reaches a third pressure (less than the process pressure; for example 60-80% of the process pressure), the clamping voltage is reduced to the third clamping voltage at 734. At 738, the pressure is increased to the process pressure. At 742, the substrate is processed.

Figure 9:
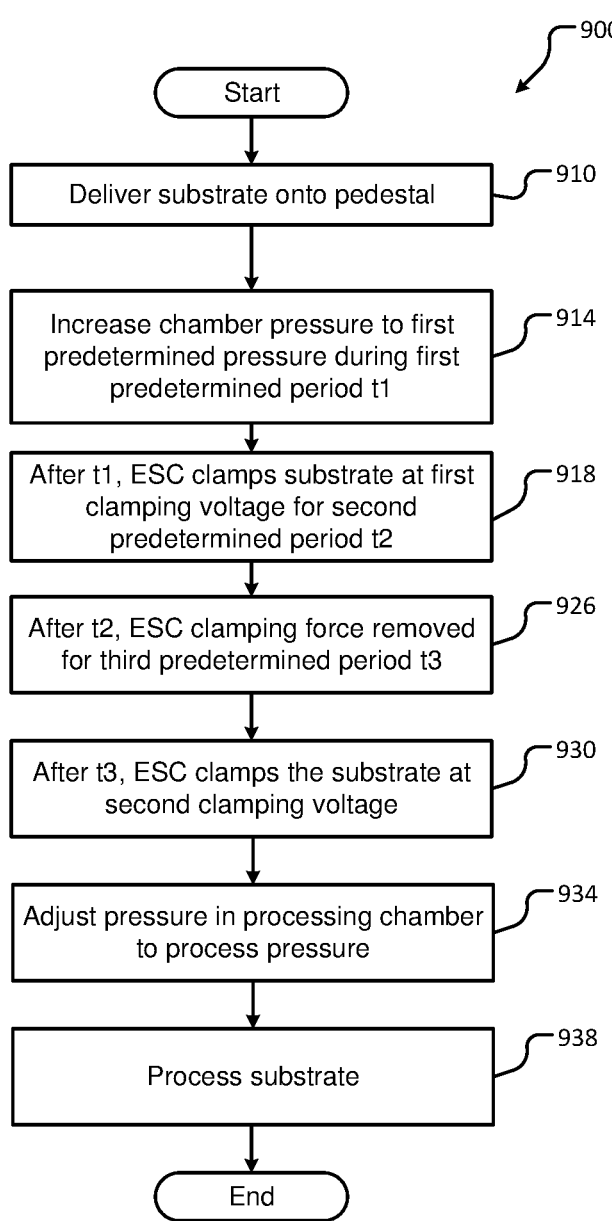
FIG. 9 is a flowchart of an example of another method for soaking and clamping a substrate according to the present disclosure.
Figure 10:
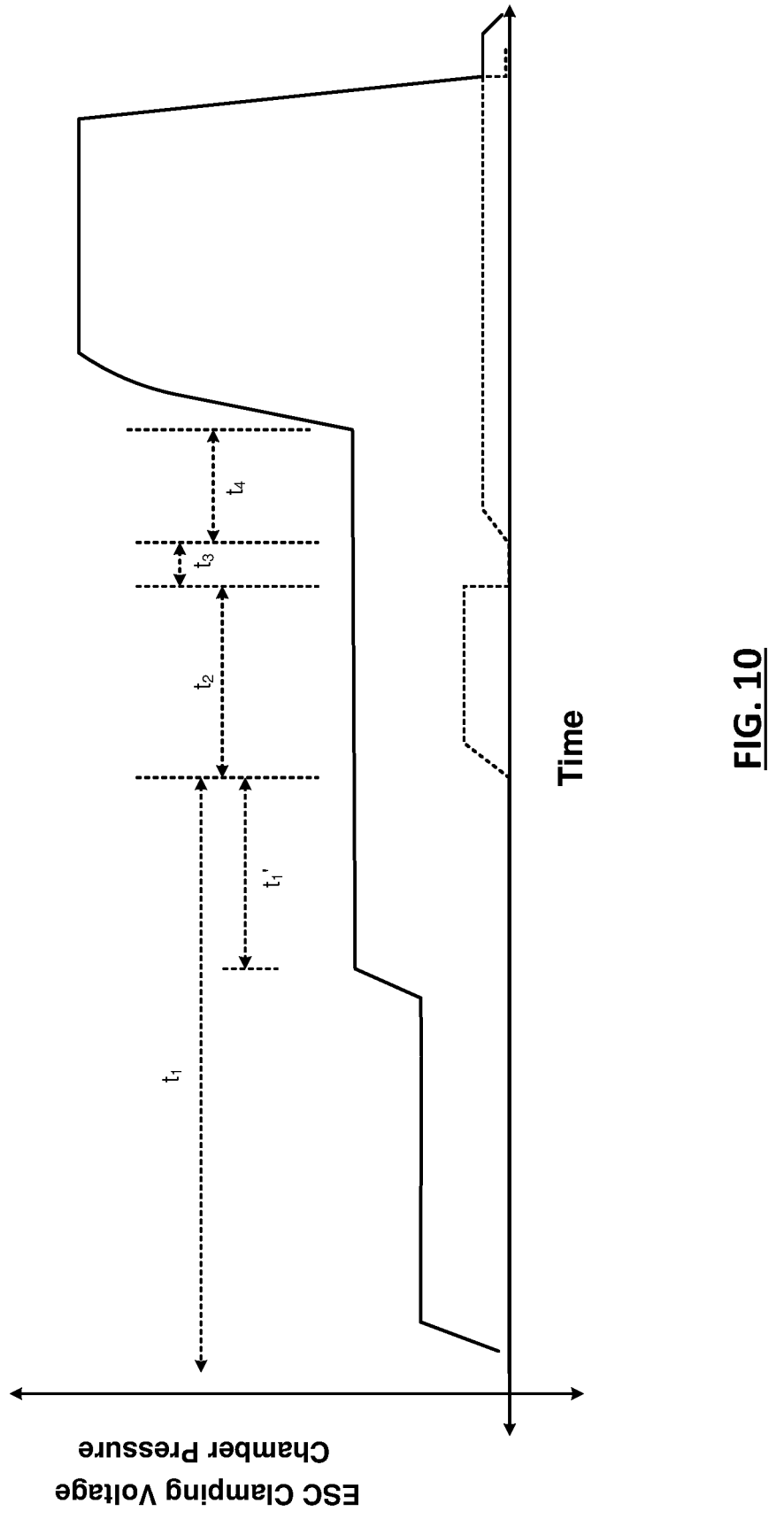
FIG. 10 is a graph illustrating an example of timing of chamber pressure changes and clamping voltage according to the present disclosure.

Referring now to FIG. 9, another method 900 for soaking and clamping a substrate is shown. The method 900 uses a dual clamping approach to soak and clamp the substrate. The chamber pressure is increased to a pressure less than the arcing pressure and less than the process pressure. Then, the substrate is fully clamped with a first clamping voltage. After a soak period during which the temperature of the substrate increases and has low non-uniformity (NU) from center to edge, the clamping voltage is removed to remove strain on the substrate. Then the substrate is clamped at the process clamping voltage which is less than the first clamping voltage. Then the pressure is increased to the process pressure and substrates are processed.

More particularly, the substrate is delivered to the pedestal at 910. At 914, pressure in the processing chamber is increased to a first predetermined pressure in a first predetermined pressure range for a first predetermined period t1. In some examples, the first predetermined pressure range is less than the arcing pressure, although other pressure ranges can be used. The substrate is soaked during a portion of the first predetermined period (e.g. t1') at the first predetermined pressure.

At 918, after t1, the ESC fully clamps the substrate using a first clamping voltage at the first predetermined pressure to uniformly soak the substrate for a second predetermined period t2. This helps the substrate to reach thermal steady state quickly with small temperature non-uniformity (NU) from the center of the substrate to the edge.

Then, after the soak for the second predetermined period t2, the ESC clamping force is reduced or fully removed at 926 for a third predetermined period t3 to allow the substrate to relax. This step removes lateral strain due to thermal expansion. After the third predetermined period t3, the ESC clamps the substrate again at 930 using a second clamping voltage. In some examples, the second clamping voltage is less than the first clamping voltage, although other clamping voltages can be used. In some examples, the second clamping voltage is in a range from 50% to 85% of the first clamping voltage, although other clamping voltages can be used.

As a result of the dual clamping and soaking approach, the substrate is clamped with less vertical strain. In some examples, the second clamping voltage is less than the first clamping voltage. After soaking for a fourth predetermined period t4, the pressure in the processing chamber is increased to process pressure at 934 and the substrate is processed at 938. In some examples, the process pressure is greater than the first predetermined pressure.

The soaking and clamping sequences described herein have improved clamping and de-clamping margins as compared to prior soaking and clamping sequences when processing high tensile, bowed substrates. Furthermore, the soaking and clamping sequences described in FIGS. 6A to 10 reduce scratches on the backside of the substrate. The soaking and clamping sequences described herein have backside longest scratch metrics that are improved relative to prior soaking and clamping sequences due the fact that the substrate is closer to a stabilized temperature when the final clamp is performed. In other words, there is less thermal expansion during the final clamp.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for processing a substrate, comprising:
   a) delivering the substrate to a pedestal of an electrostatic chuck (ESC) of a processing chamber;
   b) increasing a pressure in the processing chamber to a first predetermined pressure in a first predetermined pressure range;
   c) soaking the substrate at the first predetermined pressure for a first predetermined period without clamping the substrate;
   d) after the first predetermined period, ramping a clamping voltage supplied to the ESC to a first clamping voltage during a second predetermined period;
   e) after the second predetermined period, increasing the pressure in the processing chamber to a predetermined process pressure greater than the first predetermined pressure; and
   f) performing a treatment on the substrate at the predetermined process pressure.

2. The method of claim 1, further comprising, after e) and before f), reducing the clamping voltage to a second clamping voltage less than the first clamping voltage when the pressure is greater than a second predetermined pressure that is greater than the first predetermined pressure and less than the predetermined process pressure.

3. The method of claim 1, wherein, during the second predetermined period, the pressure is maintained at the first predetermined pressure.

4. The method of claim 1, wherein the substrate comprises a bowed substrate with bowing greater than 200 um at ambient temperature without clamping.

5. A method for soaking and clamping a substrate, comprising:

a) delivering a substrate to a pedestal of an electrostatic chuck (ESC) of a processing chamber;

b) increasing a pressure in the processing chamber to a first predetermined pressure in a first predetermined pressure range during a first predetermined period, wherein the first predetermined pressure is greater than a predetermined process pressure;

c) clamping the substrate using a first clamping voltage for a second predetermined period;

d) decreasing pressure in the processing chamber to a second predetermined pressure in a second predetermined pressure range during the second predetermined period;

e) increasing the first clamping voltage to second clamping voltage during a third predetermined period and increasing the pressure in the processing chamber; and f) performing a treatment on the substrate at the predetermined process pressure.

6. The method of claim 5, wherein the substrate comprises a bowed substrate with bowing greater than 200 um at ambient temperature without clamping.

7. A method for soaking and clamping a substrate, comprising:

a) delivering a substrate to a pedestal of an electrostatic chuck (ESC) of a processing chamber;

b) increasing a pressure in the processing chamber to a first predetermined pressure in a first predetermined pressure range during a first predetermined period;

c) after the first predetermined period, clamping the substrate at a first clamping voltage for a second predetermined period;

d) after the second predetermined period, de-clamping the substrate during a third predetermined period;

e) after the third predetermined period, clamping the substrate at a second clamping voltage for a fourth predetermined period;

f) after the fourth predetermined period, increasing the pressure in the processing chamber to a predetermined process pressure; and g) processing the substrate at the predetermined process pressure.

8. The method of claim 7, further comprising after e) and before f) reducing the second clamping voltage to a third clamping voltage that is less than the second clamping voltage when the pressure is greater than a second predetermined pressure, wherein the second predetermined pressure is greater than the first predetermined pressure and less than the predetermined process pressure.

9. The method of claim 7, wherein the pressure during the second predetermined period is the first predetermined pressure.

10. The method of claim 7, wherein the pressure during the third predetermined period is the first predetermined pressure.

11. The method of claim 7, wherein the first predetermined pressure is less than an arcing pressure.

12. A substrate processing system for processing a substrate, comprising:

a processing chamber including an electrostatic chuck with electrodes;

a gas delivery system configured to deliver a gas mixture to the processing chamber;

a voltage source configured to supply a clamping voltage to the electrodes; and a controller configured to cause the gas delivery system and the voltage source to:

a) increase a pressure in the processing chamber in one or more steps to a first predetermined pressure in a first predetermined pressure range;

b) soak the substrate at the first predetermined pressure for a first predetermined period without clamping the substrate;

c) after the first predetermined period, increase the clamping voltage supplied to the electrostatic chuck to a first clamping voltage during a second predetermined period;

d) after the second predetermined period, increase the pressure in the processing chamber to a predetermined process pressure greater than the first predetermined pressure; and e) perform a treatment on the substrate at the predetermined process pressure.

13. The substrate processing system of claim 12, further comprising, after e) and before f), the controller is further configured to reduce the clamping voltage to a second clamping voltage less than the first clamping voltage when the pressure is greater than a second predetermined pressure that is greater than the first predetermined pressure and less than the predetermined process pressure.

14. The substrate processing system of claim 12, wherein, during the second predetermined period, the pressure is maintained at the first predetermined pressure.

15. The substrate processing system of claim 12, wherein the substrate comprises a bowed substrate with bowing greater than 200 um at ambient temperature without clamping.

16. A substrate processing system for processing a substrate, comprising:

a processing chamber including an electrostatic chuck with electrodes;

a gas delivery system configured to deliver a gas mixture to the processing chamber;

a voltage source configured to supply a clamping voltage to the electrodes; and a controller configured to cause the gas delivery system and the voltage source to:

a) increase a pressure in the processing chamber in one or more steps to a first predetermined pressure in a first predetermined pressure range during a first predetermined period, wherein the first predetermined pressure is greater than a predetermined process pressure;

b) clamp the substrate using a first clamping voltage for a second predetermined period;

c) decrease pressure in the processing chamber to a second predetermined pressure in a second predetermined pressure range during the second predetermined period;

d) increase the first clamping voltage to second clamping voltage during a third predetermined period and increasing the pressure in the processing chamber; and e) perform a treatment on the substrate at the predetermined process pressure.

17. The substrate processing system of claim 16, further comprising after e) and before f), the controller is further configured to reduce the second clamping voltage to a third clamping voltage that is less than the second clamping voltage when the pressure is greater than a second predetermined pressure, wherein the second predetermined pressure is greater than the first predetermined pressure and less than the predetermined process pressure.

18. The substrate processing system of claim 16, wherein the substrate comprises a bowed substrate with bowing greater than 200 um ambient temperature without clamping.

19. A substrate processing system for processing a substrate, comprising:

a processing chamber including an electrostatic chuck with electrodes;

a gas delivery system configured to deliver a gas mixture to the processing chamber;

a voltage source configured to supply a clamping voltage to the electrodes; and a controller configured to cause the gas delivery system and the voltage source to:

a) increase a pressure in the processing chamber in one or more steps to a first predetermined pressure in a first predetermined pressure range during a first predetermined period;

b) after the first predetermined period, clamp the substrate at a first clamping voltage for a second predetermined period;

c) after the second predetermined period, de-clamp the substrate during a third predetermined period;

d) after the third predetermined period, clamp the substrate at a second clamping voltage for a fourth predetermined period;

e) after the fourth predetermined period, increase the pressure in the processing chamber to a predetermined process pressure; and f) process the substrate at the predetermined process pressure.

20. The substrate processing system of claim 19, further comprising, after e) and before f), the controller is further configured to reduce the clamping voltage to a third clamping voltage less than the first clamping voltage when the pressure is greater than a second predetermined pressure that is greater than the first predetermined pressure and less than the predetermined process pressure.

21. The substrate processing system of claim 19, wherein, during the second predetermined period, the controller is configured to maintain the pressure at the first predetermined pressure.

22. The substrate processing system of claim 19, wherein the substrate comprises a bowed substrate with bowing greater than 200 um at ambient temperature without clamping.

* * * * *